United States Patent
Yokoyama et al.

(10) Patent No.: US 10,566,222 B2
(45) Date of Patent: Feb. 18, 2020

(54) SEMICONDUCTOR DEVICE SORTING SYSTEM AND SEMICONDUCTOR DEVICE

(71) Applicant: Mitsubishi Electric Corporation, Tokyo (JP)

(72) Inventors: Shuhei Yokoyama, Tokyo (JP); Maki Hasegawa, Tokyo (JP); Hiroyuki Nakamura, Tokyo (JP); Shigeru Mori, Tokyo (JP); Toru Iwagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/113,731

(22) Filed: Aug. 27, 2018

(65) Prior Publication Data
US 2019/0103297 A1    Apr. 4, 2019

(30) Foreign Application Priority Data
Oct. 4, 2017    (JP) .................................. 2017-193967

(51) Int. Cl.
*H01L 21/00* (2006.01)
*H01L 23/544* (2006.01)
(Continued)

(52) U.S. Cl.
CPC ...... *H01L 21/67271* (2013.01); *B07C 5/3412* (2013.01); *H01L 21/67294* (2013.01);
(Continued)

(58) Field of Classification Search
CPC ......... H01L 21/67271; H01L 21/67294; H01L 21/768; H01L 21/67288; H01L 23/544;
(Continued)

(56) References Cited

U.S. PATENT DOCUMENTS 7,299,973 B2 * 11/2007 Kudo ..................... G06K 1/126
235/375
8,489,924 B2 *  7/2013 Nakatsugawa ....... G06F 11/008
702/81
(Continued)

FOREIGN PATENT DOCUMENTS

JP          H11-26333 A      1/1999

*Primary Examiner* — Nikolay K Yushin
(74) *Attorney, Agent, or Firm* — Studebaker & Brackett PC (57) ABSTRACT

It is an object to provide a technique capable of providing a semiconductor device with information indicating a plurality of electrical characteristics. A semiconductor device sorting system includes a characteristic measurement unit measuring electrical characteristics of a semiconductor device, a rank determination database for classifying the electrical characteristics into ranks, a calculation unit classifying the plurality of electrical characteristics of the semiconductor device measured by the characteristic measurement unit into a plurality of ranks with reference to the rank determination database, a writing unit converting the plurality of ranks classified by the calculation unit into a graphic symbolic code and forming the graphic symbolic code on the semiconductor device, a reading unit reading the plurality of ranks from the graphic symbolic code formed on the semiconductor device, and a sorting unit sorting the semiconductor device based on the plurality of ranks being read by the reading unit.

6 Claims, 8 Drawing Sheets

(51) Int. Cl.
 *B07C 5/34* (2006.01)
 *H01L 21/67* (2006.01)
(52) U.S. Cl.
 CPC .... *H01L 23/544* (2013.01); *H01L 2223/5442* (2013.01); *H01L 2223/54433* (2013.01); *H01L 2223/54486* (2013.01)
(58) Field of Classification Search
 CPC ................. H01L 23/528; H01L 23/573; H01L 2223/5442; B07C 5/3412
 See application file for complete search history.

(56) References Cited

U.S. PATENT DOCUMENTS

2002/0036235 A1   3/2002  Kudo
2005/0246390 A1*  11/2005 House ..................... G06F 16/22

\* cited by examiner

| RANK | RANK INFORMATION |
|---|---|
| A | 00 |
| B | 01 |
| C | 10 |
| D | 11 |

FIG. 6

| SERIAL | OUTPUT SATURATION VOLTAGE | ON RESISTANCE | SWITCHING TIME | RANK INFORMATION |
|---|---|---|---|---|
| XXXXXX | RANK A | RANK B | RANK C | 000110 |
| XXXXXX | RANK D | RANK B | RANK B | 110101 |
| XXXXXX | RANK C | RANK D | RANK A | 101100 |
| ⋮ | ⋮ | ⋮ | ⋮ | ⋮ |

SEMICONDUCTOR DEVICE SORTING SYSTEM AND SEMICONDUCTOR DEVICE

BACKGROUND OF THE INVENTION

Field of the Invention

The present invention relates to a semiconductor device sorting system.

Description of the Background Art

Semiconductor devices are sorted using predetermined characteristic data indicating electrical characteristics of semiconductor devices in a shipping process to ship a semiconductor device which matches needs of a client.

Japanese Patent Application Laid-Open No. 11-26333 describes a method of sorting a product by providing a two-dimensional code with only ID data and reading out characteristic data stored in a database on a system from the ID data.

However, a conventional method as Japanese Patent Application Laid-Open No. 11-26333 needs maintenance and an operation of a system of referring to the database based on the ID data of the two-dimensional code to know the electrical characteristics of the product. Considered accordingly is a method of directly providing the two-dimensional code with the characteristic data as a method of simply achieving the above needs, however, the two-dimensional code with which the semiconductor device can be provided has a small data capacity, so that there is a problem that the two-dimensional code cannot be provided with a plurality of pieces of the characteristic data.

SUMMARY

It is an object of the present invention to provide a technique capable of providing a semiconductor device with information indicating a plurality of electrical characteristics.

A semiconductor device sorting system according to the present invention includes a characteristic measurement unit, a rank determination database, a calculation unit, a writing unit, a reading unit, and a sorting unit. The characteristic measurement unit measures electrical characteristics of a semiconductor device. The rank determination database is a database for classifying the electrical characteristics into ranks. The calculation unit classifies the plurality of electrical characteristics of the semiconductor device measured by the characteristic measurement unit into a plurality of ranks with reference to the rank determination database. The writing unit converts the plurality of ranks classified by the calculation unit into a graphic or a symbolic code and forms the graphic or the symbolic code on the semiconductor device. The reading unit reads a plurality of ranks from the graphic or the symbolic code formed on the semiconductor device. The sorting unit sorts the semiconductor device based on the plurality of ranks being read by the reading unit.

A data amount can be reduced by classifying the electrical characteristics of the semiconductor device into the ranks, thus the semiconductor device can be provided with the information indicating the plurality of electrical characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

<Embodiment 1>

Figure 1:
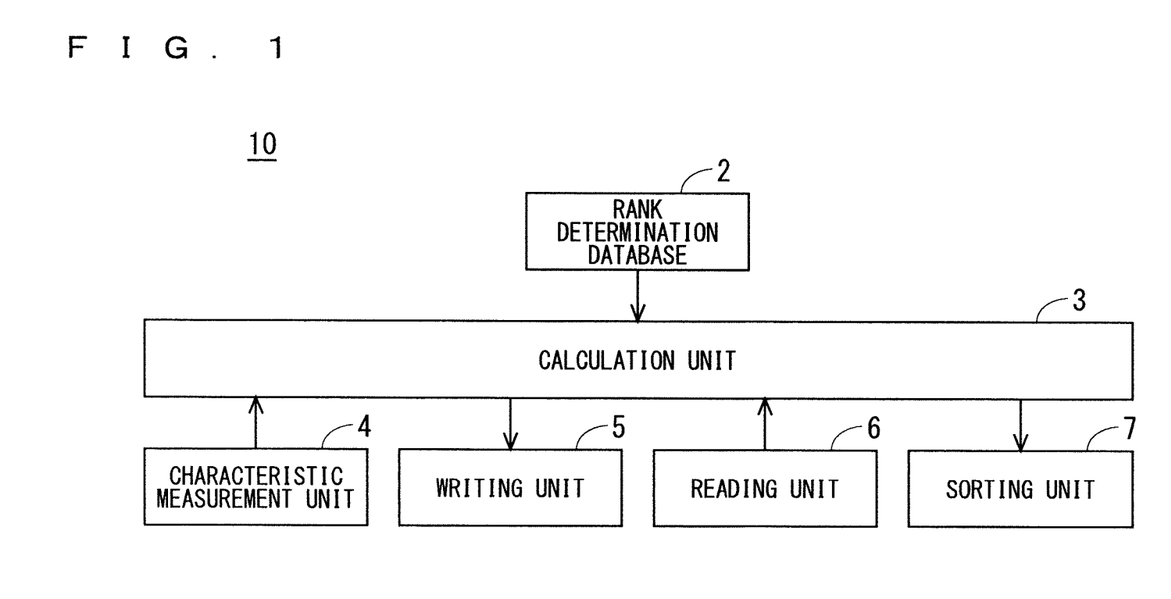
FIG. 1 is a block diagram of a semiconductor device sorting system according to an embodiment 1.
Figure 2:
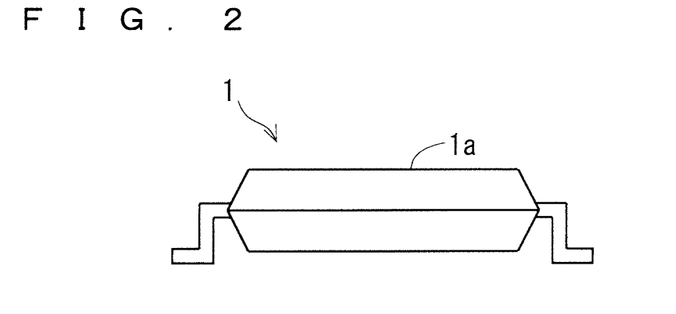
FIG. 2 is a front view of a semiconductor device sorted by the semiconductor device sorting system.
Figure 3:
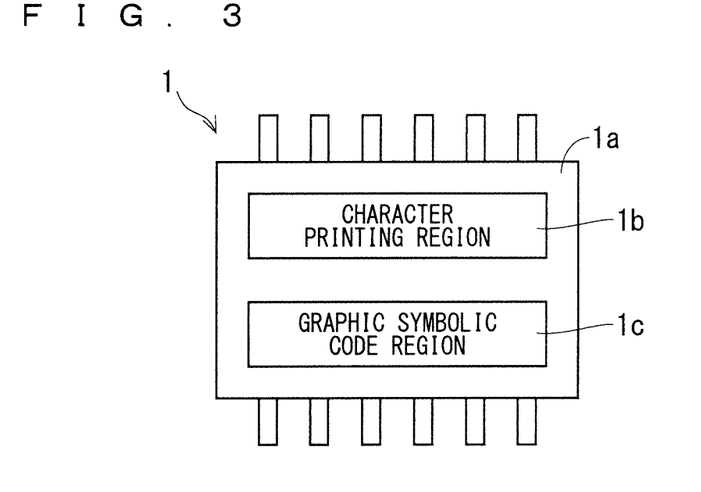
FIG. 3 is a front view of the semiconductor device.
Figure 4:
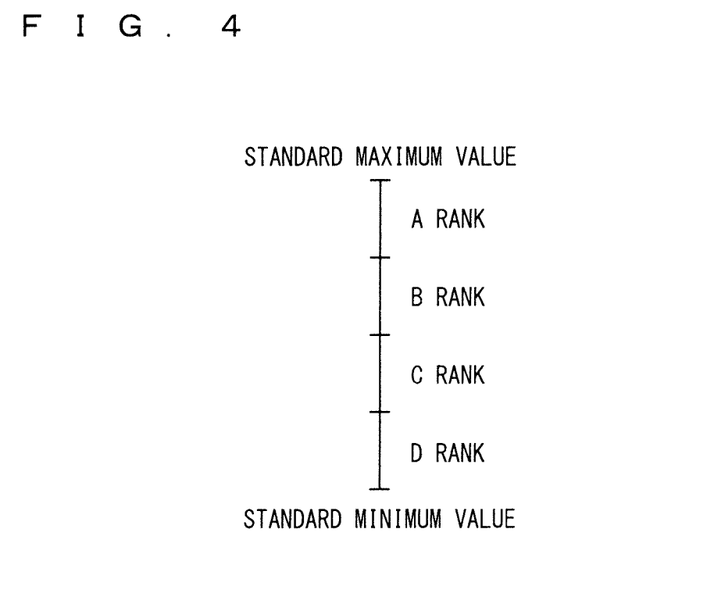
FIG. 4 is a drawing illustrating a determination example of a rank.
Figure 5:
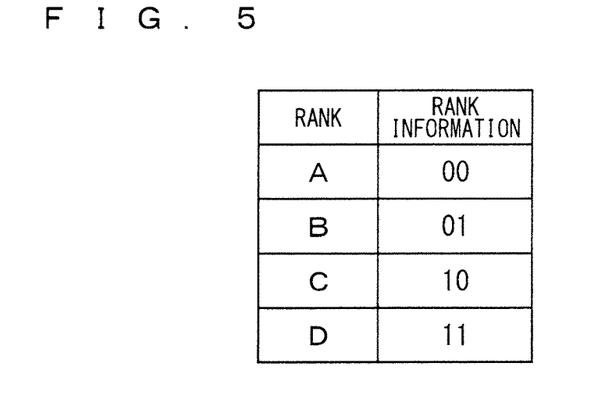
FIG. 5 is a drawing illustrating a correspondence table between a rank and rank information.
Figure 6:
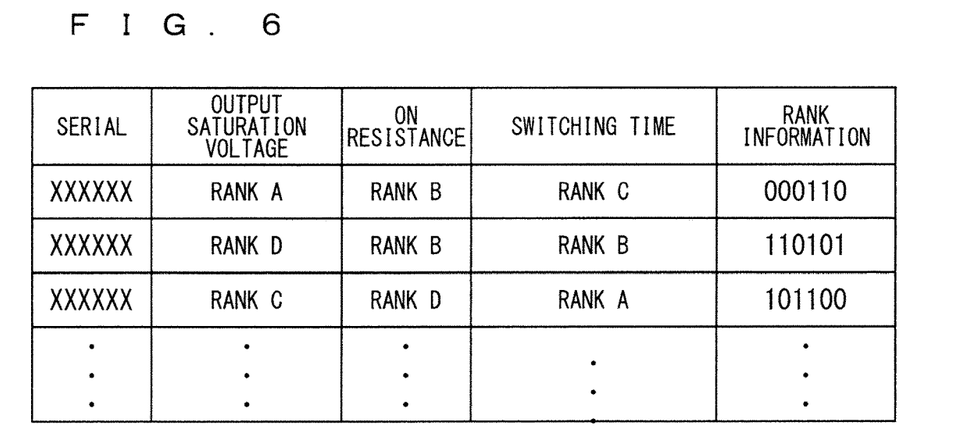
FIG. 6 is a drawing illustrating a table in which ranks and pieces of rank information of a plurality of electrical characteristics of each semiconductor device are described.

The embodiment 1 of the present invention is described hereinafter using the drawings. FIG. 1 is a block diagram of a semiconductor device sorting system 10 according to the embodiment 1. FIG. 2 is a front view of a semiconductor device 1 sorted by the semiconductor device sorting system 10. FIG. 3 is a front view of the semiconductor device 1. FIG. 4 is a drawing illustrating a determination example of a rank. FIG. 5 is a drawing illustrating a correspondence table between a rank and rank information. FIG. 6 is a drawing illustrating a table in which ranks and pieces of rank information of a plurality of electrical characteristics of each semiconductor device 1 are described.

As illustrated in FIG. 1, the semiconductor device sorting system 10 includes a rank determination database 2, a calculation unit 3, a characteristic measurement unit 4, a writing unit 5, a reading unit 6, and a sorting unit 7.

The characteristic measurement unit 4, which is a semiconductor testing device, measures electrical characteristics of the semiconductor device 1. Herein, the electrical characteristics indicates, for example, an output saturation voltage, on resistance, and a switching time.

The rank determination database 2, which is a database for classifying the electrical characteristics into ranks, is stored in the calculation unit 3. The calculation unit 3 is a PC, and classifies the plurality of electrical characteristics of the semiconductor device 1 measured by the characteristic measurement unit 4 into a plurality of ranks with reference to the rank determination database 2.

The writing unit 5, which is a laser marking device, converts the plurality of ranks classified by the calculation unit 3 into a graphic or a symbolic code (referred to as "the graphic symbolic code" hereinafter) and marks and forms the graphic symbolic code on the semiconductor device 1.

The reading unit 6 is a camera, and reads the plurality of ranks from the graphic symbolic code formed on the semiconductor device 1. The sorting unit 7 is a sorting device for sorting the semiconductor device 1, and sorts the semiconductor device 1 based on the plurality of ranks being read by the reading unit 6.

Next, the rank of the electrical characteristics of the semiconductor device 1 is described. As illustrated in FIG. 2 and FIG. 3, a character printing region 1b and a graphic symbolic code region 1c are provided on an upper surface 1a of the semiconductor device 1. Since the character printing region 1b is a region used in a modification example of the embodiment 3, the description is omitted herein. The graphic symbolic code region 1c is a region in which the graphic symbolic code is marked.

As illustrated in FIG. 4, the measured electrical characteristics are classified into four ranks of A rank, B rank, C rank, and D rank in a range from a standard maximum value to a standard minimum value, for example.

The classified rank is converted into rank information with reference to the correspondence table illustrated in FIG. 5. The A rank is converted into rank information "00", the B rank is converted into rank information "01", the C rank is converted into rank information "10", and the D rank is converted into rank information "11".

A method of classifying the measured plurality of electrical characteristics into the plurality of ranks is described next. For example, as illustrated in FIG. 6, in a case of the semiconductor device 1 in which the output saturation voltage is classified into the rank A, the on resistance is classified into the rank B, and the switching time is classified into the rank C, the pieces of rank information are "00", "01", and "10". Then, these pieces of information are connected to each other to make the rank information of "000110". The rank information of "000110" converted into the graphic symbolic code is marked in the graphic symbolic code region 1c.

Figure 7:
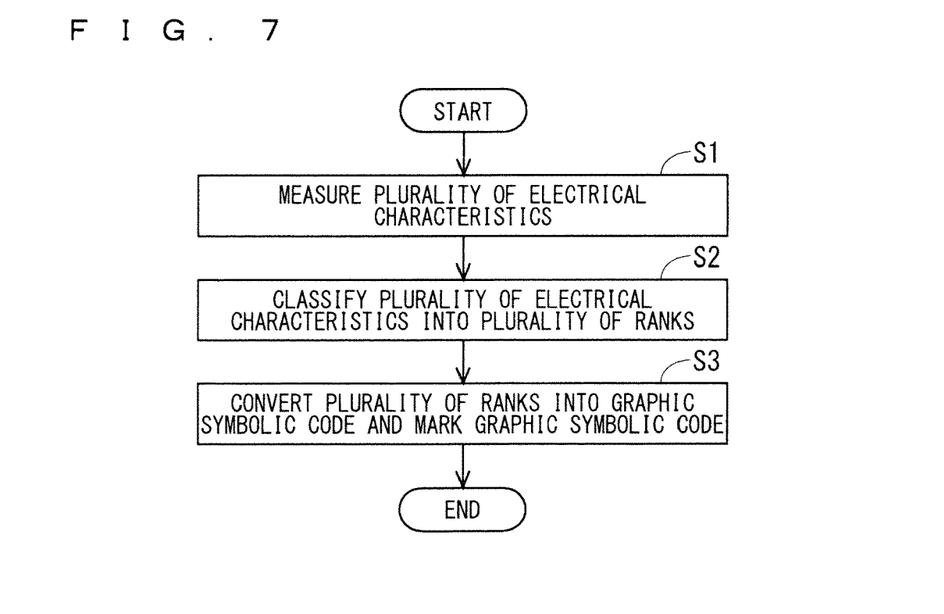
FIG. 7 is a flow chart of writing processing of the rank information.

Next, the writing processing of the rank information is described using FIG. 7. FIG. 7 is a flow chart of the writing processing of the rank information. As illustrated in FIG. 7, when the writing processing of the rank information is started, the characteristic measurement unit 4 firstly measures the plurality of electrical characteristics of the semiconductor device 1 (Step S1). The calculation unit 3 refers to the rank determination database 2, classifies the measured plurality of electrical characteristics into the plurality of ranks, and generates the rank information (Step S2). The writing unit 5 converts the rank information indicating the classified plurality of ranks into the graphic symbolic code and marks the graphic symbolic code on the semiconductor device 1 (Step S3), thereby finishing the writing processing. The semiconductor device 1 on which the graphic symbolic code is marked is stored in a storehouse, for example.

Figure 8:
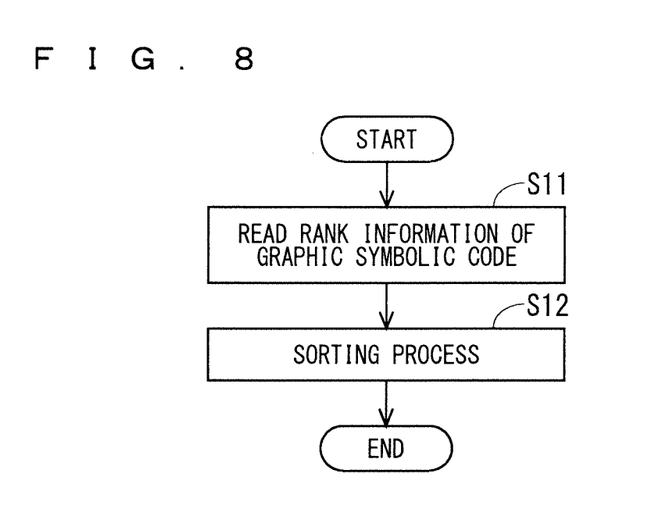
FIG. 8 is a flow chart of sorting processing of the semiconductor device.

Next, the sorting processing is described using FIG. 8. FIG. 8 is a flow chart of the sorting processing of the semiconductor device 1. The sorting processing is performed when the semiconductor device 1 stored in the storehouse, for example, is shipped. As illustrated in FIG. 8, the reading unit 6 reads the plurality of ranks from the graphic symbolic code marked on the semiconductor device 1 (Step S11). The sorting unit 7 sorts the semiconductor device 1 based on the plurality of ranks (Step S12), thereby finishing the sorting processing.

Since the graphic symbolic code indicating the plurality of electrical characteristics is formed on the semiconductor device 1, even when the semiconductor device 1 having the different electrical characteristics is required from the plurality of users of the semiconductor device, the reading unit 6 can be used in common. For example, even when there are a request from a company A that products having the same output saturation voltage need to be shipped to parallelly connect and use the semiconductor devices 1 and a request from a company B that products having low on resistance need to be shipped to reduce a loss as much as possible, for example, one reading unit 6 can meet those requests.

Since the graphic symbolic code is formed in the graphic symbolic code region 1c in the upper surface 1a of the semiconductor device 1, the graphic symbolic code has a limited size, so that the data capacity is limited. However, the information of the electrical characteristics is not directly formed but classified into the ranks, thus the data amount can be reduced. Accordingly, the rank information indicating the plurality of electrical characteristics can be formed in the graphic symbolic code region 1c.

As described above, the semiconductor device sorting system 10 according to the embodiment 1 includes the characteristic measurement unit 4 measuring the electrical characteristics of the semiconductor device 1, the rank determination database 2 for classifying the electrical characteristics into the ranks, the calculation unit 3 classifying the plurality of electrical characteristics of the semiconductor device 1 measured by the characteristic measurement unit 4 into the plurality of ranks with reference to the rank determination database 2, the writing unit 5 converting the plurality of ranks classified by the calculation unit 3 into the graphic symbolic code and forming the graphic symbolic code on the semiconductor device 1, the reading unit 6 reading the plurality of ranks from the graphic symbolic code formed on the semiconductor device 1, and the sorting unit 7 sorting the semiconductor device 1 based on the plurality of ranks being read by the reading unit 6.

Accordingly, the data amount can be reduced by classifying the electrical characteristics of the semiconductor device 1 into the ranks, thus the semiconductor device 1 can be provided with the information indicating the plurality of electrical characteristics.

Since the semiconductor device 1 has the graphic symbolic code indicating the plurality of ranks into which the plurality of electrical characteristics of the semiconductor device 1 are classified, a supplier of the semiconductor device can sort the semiconductor device 1 based on the plurality of ranks. According to the above configuration, efficiency of distribution form of the semiconductor device 1 can be enhanced.

<Modification Example of Embodiment 1>

Figure 9:
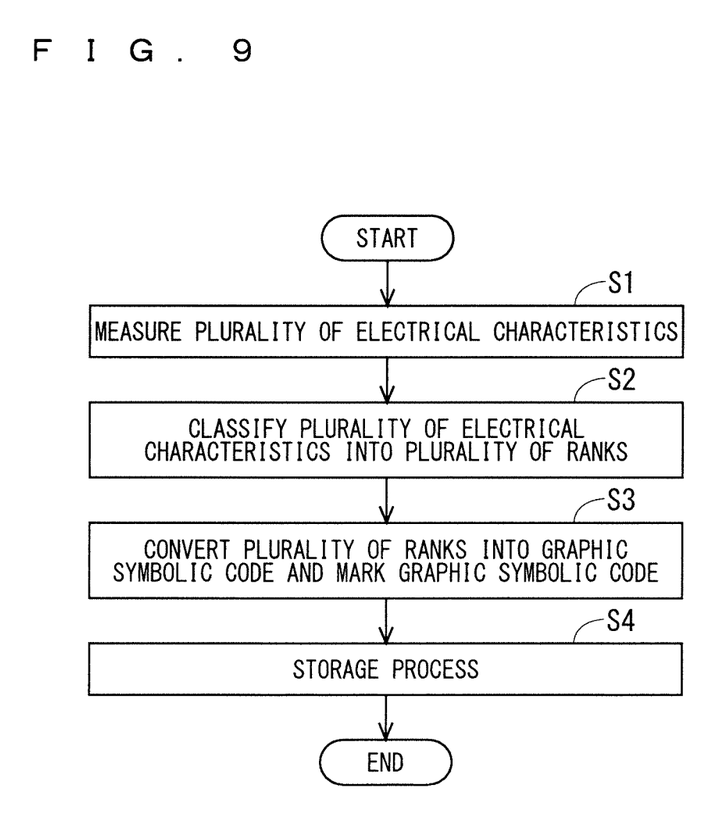
FIG. 9 is a flow chart of writing processing of the rank information according to a modification example of the embodiment 1.

Next, the modification example of the embodiment 1 is described. FIG. 9 is a flow chart of writing processing of the rank information according to the modification example of the embodiment 1. As illustrated in FIG. 9, in the modification example 1 of the embodiment 1, a storage process for grasping a total number of stocks for each rank is added after the graphic symbolic code is marked on the semiconductor device 1 in the writing processing of the rank information.

Next, the writing processing of the rank information is described with reference to FIG. 9. The steps of Step S1 to Step S3 are performed in the manner similar to the case of FIG. 7, and the storage process is performed in the next Step S4. In the storage process, the calculation unit 3 records the number of stocks of the semiconductor device 1 for each rank of the electrical characteristics in a memory of the calculation unit 3, for example, thereby finishing the writing processing. The semiconductor device 1 on which the graphic symbolic code is marked is stored in a storehouse, for example.

As described above, according to the modification example of the embodiment 1, the calculation unit 3 records the number of stocks of the semiconductor device 1 for each rank of the electrical characteristics, thus the supplier of the semiconductor device can check the recorded number of stocks and ship the semiconductor device 1 in order of the number of stocks to the user of the semiconductor device who is satisfied with the semiconductor device 1 within product standards thereof, for example. A variation of the stocks for each rank can be thereby reduced.

<Embodiment 2>

Figure 10:
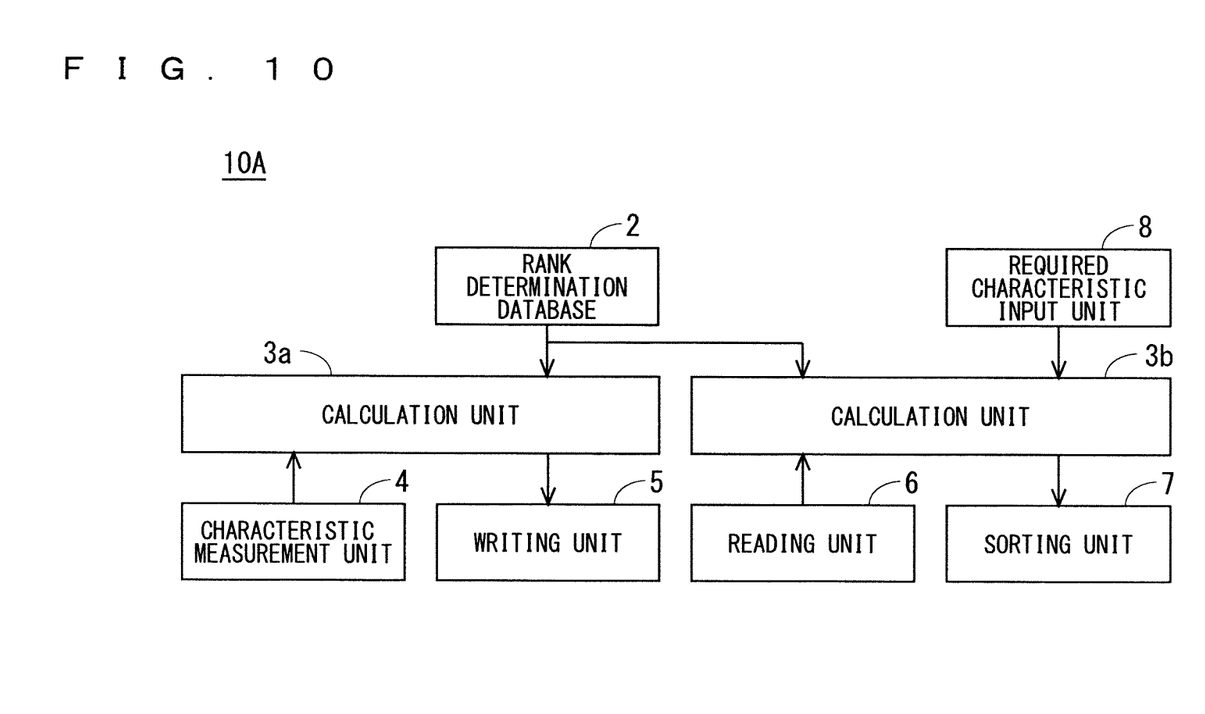
FIG. 10 is a block diagram of a semiconductor device sorting system according to an embodiment 2.
Figure 11:
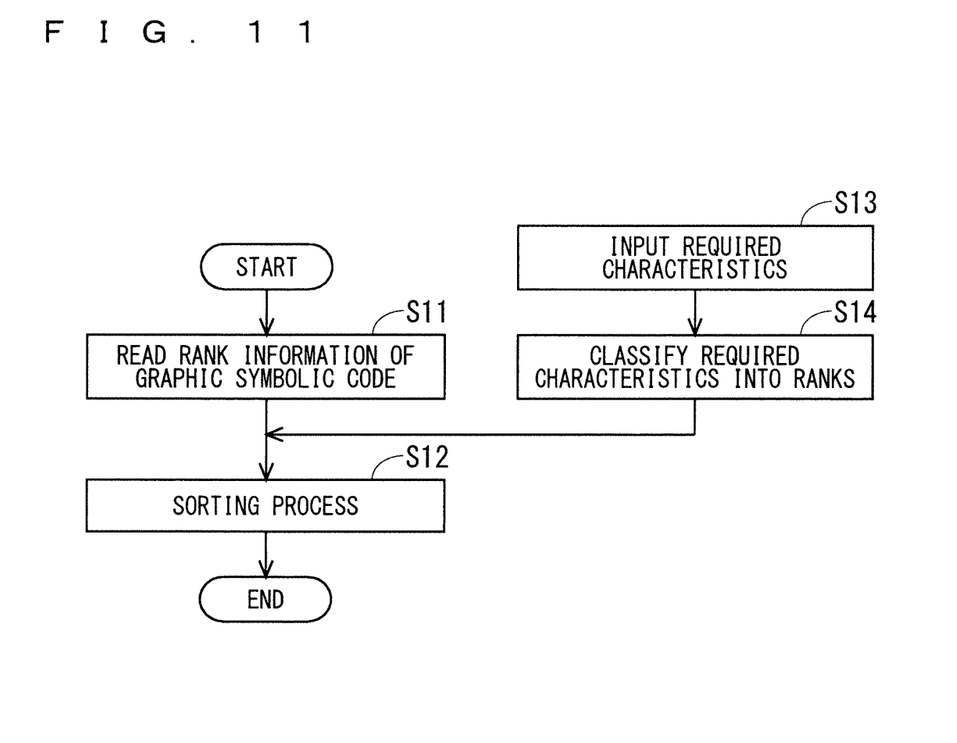
FIG. 11 is a flow chart of sorting processing of a semiconductor device.

Next, a semiconductor device sorting system 10A according to the embodiment 2 is described. FIG. 10 is a block diagram of the semiconductor device sorting system 10A according to the embodiment 2. FIG. 11 is a flow chart of sorting processing of the semiconductor device 1. The same reference numerals as those described in the embodiment 1 will be assigned to the same element in the embodiment 2, and a repetitive description is omitted.

In the embodiment 2, the semiconductor device 1 is sorted based on a plurality of ranks being read from the graphic symbolic code and ranks of requested characteristics requested from the user of the semiconductor device.

As illustrated in FIG. 10, the semiconductor device sorting system 10A includes the rank determination database 2, calculation units 3a and 3b, the characteristic measurement unit 4, the writing unit 5, the reading unit 6, the sorting unit 7, and a requested characteristic input unit 8. The calculation units 3a and 3b may be separated PCs, or may be one PC.

The requested characteristic input unit 8 is a PC. More specifically, the requested characteristic input unit 8 is an input device such as a keyboard and a mouse of the PC constituting the calculation unit 3b. The requested characteristics requested from the user of the semiconductor device are input from the requested characteristic input unit 8. Herein, the requested characteristics are electrical characteristics requested from the user of the semiconductor device for the semiconductor device 1.

Next, the sorting processing is described using FIG. 11. FIG. 11 is a flow chart of the sorting processing of the semiconductor device 1. As illustrated in FIG. 11, the reading unit 6 reads the plurality of ranks from the graphic symbolic code marked on the semiconductor device 1 (Step S11). The requested characteristics are input from the requested characteristic input unit 8 by the supplier of the semiconductor device (Step S13). Herein, one or a plurality of requested characteristics may be input from the requested characteristic input unit 8. The calculation unit 3b classifies the requested characteristics being input from the requested characteristic input unit 8 into the ranks with reference to the rank determination database 2 (Step S14). The sorting unit 7 sorts the semiconductor device 1 based on the plurality of ranks being read from the graphic symbolic code and the ranks of the requested characteristics requested from the user of the semiconductor device (Step S12), thereby finishing the sorting processing.

As described above, the semiconductor device sorting system 10A according to the embodiment 2 further includes the requested characteristic input unit 8 from which the requested characteristics of the user of the semiconductor device is input. The calculation unit 3b classifies the requested characteristics being input from the requested characteristic input unit 8 into the ranks with reference to the rank determination database 2. The sorting unit 7 sorts the semiconductor device 1 further based on the rank of the requested characteristics.

Accordingly, the requested characteristics of the user of the semiconductor device is made to correspond to the rank determination database 2 and checked against the electrical characteristics of the semiconductor device 1, thus the semiconductor device 1 satisfying the requested characteristics of the user of the semiconductor device can be sorted. This leads to a reduction in time for the classification at the time of shipping the product requested from the user of the semiconductor device.

<Embodiment 3>

Figure 12:
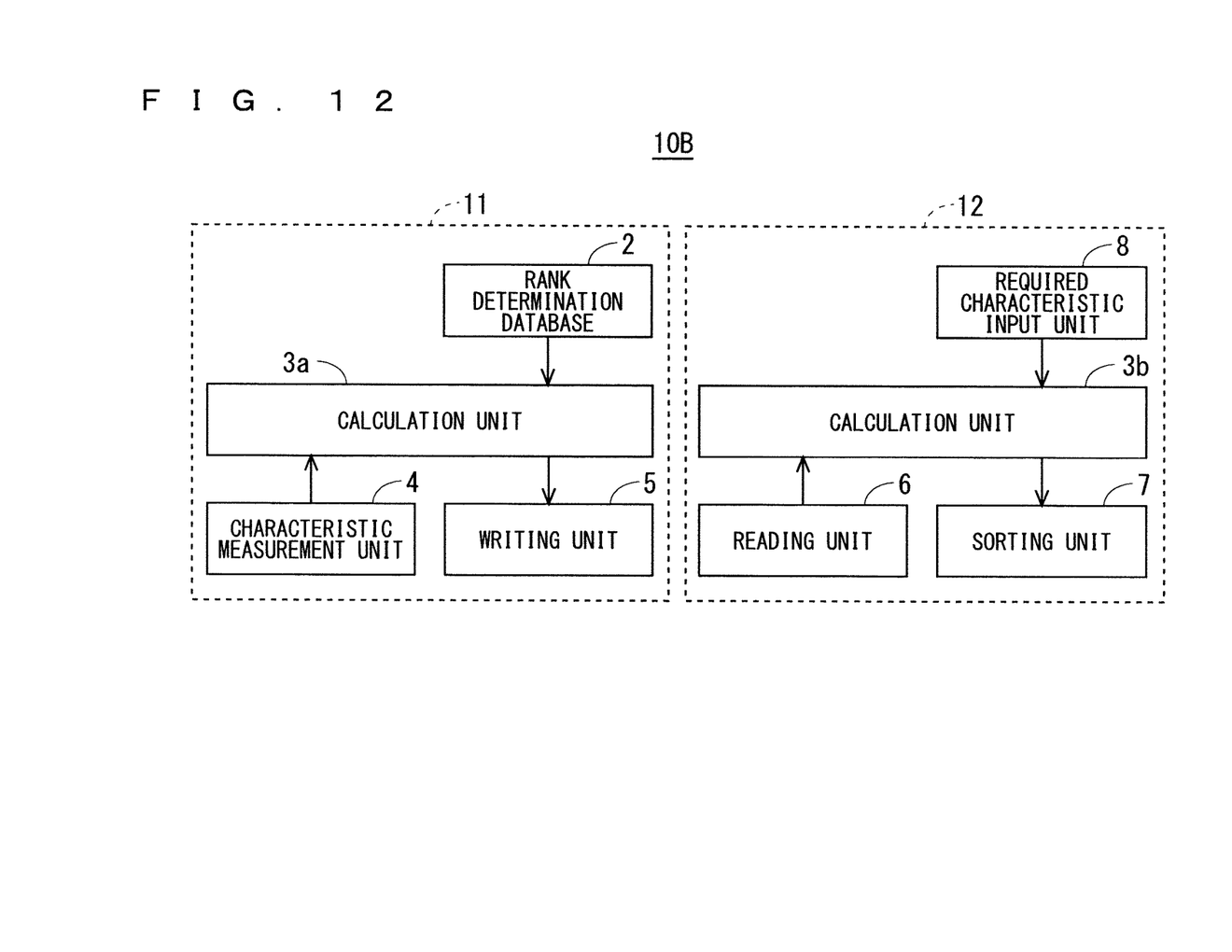
FIG. 12 is a block diagram of a semiconductor device sorting system according to an embodiment 3.

Next, a semiconductor device sorting system 10B according to the embodiment 3 is described. FIG. 12 is a block diagram of the semiconductor device sorting system 10B according to the embodiment 3. The same reference numerals as those described in the embodiments 1 and 2 will be assigned to the same element in the embodiment 3, and a repetitive description is omitted.

In the embodiments 1 and 2, the supplier of the semiconductor device performs both the writing processing and the sorting processing of the rank information, however, in the embodiment 3, the supplier of the semiconductor device performs the writing processing of the rank information, and the user of the semiconductor device performs the sorting processing.

As illustrated in FIG. 12, a part of the semiconductor device sorting system 10B (referred to as "a supplier side device 11" hereinafter) is disposed on a side of the supplier of the semiconductor device. The supplier side device 11 includes the rank determination database 2, the calculation unit 3a, the characteristic measurement unit 4, and the writing unit 5.

A remaining part of the semiconductor device sorting system 10B (referred to as "a user side device 12" hereinafter) is disposed on a side of the user of the semiconductor device. The user side device 12 includes the calculation unit 3b, the reading unit 6, the sorting unit 7, and the requested characteristic input unit 8. The supplier side device 11 and the user side device 12 are further connected to each other via an Internet connection using an optical fiber network or a phone line, for example, thus the rank determination database 2 of the supplied side device 11 can also be accessed from the calculation unit 3b of the user side device 12.

Performed in the supplier side device 11 is the same processing as the writing processing of the rank information which is described using the flow chart of FIG. 7. Performed in the user side device 12 is the same processing as the sorting processing of the semiconductor device 1 which is described using the flow chart of FIG. 11.

As described above, in the semiconductor device sorting system 10B according to the embodiment 3, the reading unit 6 and the sorting unit 7 are disposed on the side of the user of the semiconductor device, thus the sorting processing can be omitted from the side of the supplier of the semiconductor device. The supplier of the semiconductor device can thereby ship the semiconductor device 1 in a shorter time.

<Modification Example of Embodiment 3>

Figure 13:
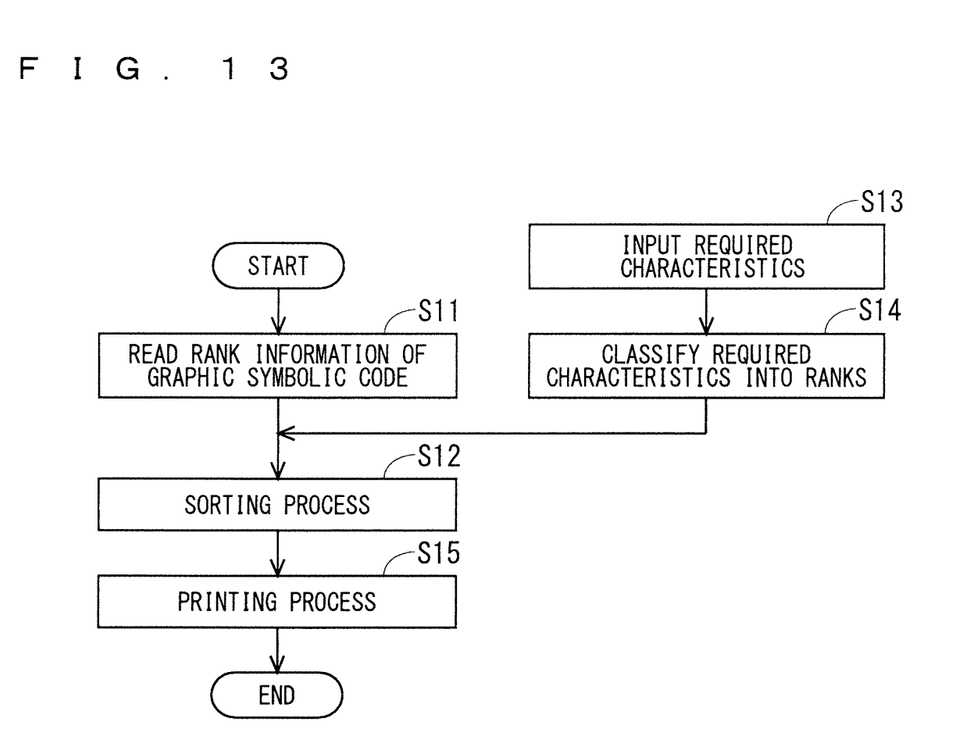
FIG. 13 is a flow chart of sorting processing of a semiconductor device according to a modification example of the embodiment 3.

Next, the modification example of the embodiment 3 is described. FIG. 13 is a flow chart of sorting processing of the semiconductor device 1 according to the modification example of the embodiment 3. As illustrated in FIG. 13, in the modification example of the embodiment 3, a printing process is added in the sorting processing.

Next, the sorting processing is described with reference to FIG. 13. The steps of Step S11 to Step S14 are performed in the manner similar to the case of FIG. 11, and the printing process is performed in Step S15 after the sorting process. The user side device 12 further includes a writing unit having a function of printing, and in the printing process, the rank information is printed in the character printing region 1b illustrated in FIG. 1. The character printing region 1b is the region in which the rank information is printed without change. The writing unit is a laser marking device.

As described above, in the modification example of the embodiment 3, the user of the semiconductor device can recognize the rank information of the semiconductor device 1 just by seeing an appearance of the semiconductor device 1 even in the case where the user side device 12 does not include the reading unit 6.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device sorting system, comprising:
    a characteristic measurement unit measuring electrical characteristics of a semiconductor device;
    a rank determination database for classifying the electrical characteristics into ranks;
    a calculation unit classifying each of the measured electrical characteristics of the semiconductor device into a respective rank with reference to the rank determination database, and combining a plurality of ranks into rank information;
    a writing unit converting the rank information into a graphic or a symbolic code and forming the graphic or the symbolic code on the semiconductor device;
    a reading unit reading the plurality of ranks from the rank information obtained from the graphic or the symbolic code formed on the semiconductor device; and
    a sorting unit sorting the semiconductor device based on the plurality of ranks being read by the reading unit.

2. The semiconductor device sorting system according to claim 1, wherein
    the calculation unit records a total number of stocks of the semiconductor device for each rank of the electrical characteristics.

3. The semiconductor device sorting system according to claim 1, further comprising
    a requested characteristic input unit from which requested characteristics requested from a user of the semiconductor device are input, wherein
    the calculation unit classifies the requested characteristics being input from the requested characteristic input unit into ranks with reference to the rank determination database, and
    the sorting unit sorts the semiconductor device further based on the ranks of the requested characteristics.

4. The semiconductor device sorting system according to claim 3, wherein
    the reading unit and the sorting unit are disposed on a side of the user of the semiconductor device.

5. The semiconductor device sorting system according to claim 4, wherein
    the writing unit prints a plurality of ranks into which a plurality of the electrical characteristics are classified on the semiconductor device.

6. A semiconductor device, comprising
    a graphic or a symbolic code indicating rank information that includes a plurality of ranks, each of which is classified for a respective electrical characteristic among a plurality of electrical characteristics measured from the semiconductor device.

* * * * *